(12) United States Patent
Liu et al.

(10) Patent No.: US 11,515,395 B2
(45) Date of Patent: Nov. 29, 2022

(54) GALLIUM NITRIDE POWER DEVICE AND MANUFACTURING METHOD THEREOF

(71) Applicants: SOUTHEAST UNIVERSITY, Jiangsu (CN); CSMC TECHNOLOGIES FAB2 CO., LTD, Jiangsu (CN)

(72) Inventors: Siyang Liu, Jiangsu (CN); Ningbo Li, Jiangsu (CN); Dejin Wang, Jiangsu (CN); Kui Xiao, Jiangsu (CN); Chi Zhang, Jiangsu (CN); Sheng Li, Jiangsu (CN); Xinyi Tao, Jiangsu (CN); Weifeng Sun, Jiangsu (CN); Longxing Shi, Jiangsu (CN)

(73) Assignees: SOUTHEAST UNIVERSITY, Jiangsu (CN); CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 17/624,336

(22) PCT Filed: Sep. 25, 2020

(86) PCT No.: PCT/CN2020/117576
§ 371 (c)(1),
(2) Date: Dec. 31, 2021

(87) PCT Pub. No.: WO2021/057874
PCT Pub. Date: Apr. 1, 2021

(65) Prior Publication Data
US 2022/0223692 A1   Jul. 14, 2022

(30) Foreign Application Priority Data
Sep. 26, 2019 (CN) .......................... 201910919577.5

(51) Int. Cl.
*H01L 29/872* (2006.01)
*H01L 29/20* (2006.01)
(Continued)

(52) U.S. Cl.
CPC .... *H01L 29/2003* (2013.01); *H01L 21/02389* (2013.01); *H01L 29/0619* (2013.01);
(Continued)

(58) Field of Classification Search
None
See application file for complete search history.

(56) References Cited

FOREIGN PATENT DOCUMENTS

| CN | 103337459 A | 10/2013 |
|---|---|---|
| CN | 107083535 A | 8/2017 |
| JP | 2007281231 A | 10/2007 |

*Primary Examiner* — Grant S Withers
(74) *Attorney, Agent, or Firm* — Global IP Services; Tianhua Gu (57) ABSTRACT

A gallium nitride power device, including: a gallium nitride substrate; cathodes; a plurality of gallium nitride protruding structures arranged on the gallium nitride substrate and between the cathodes, a groove is formed between adjacent gallium nitride protruding structures; an electron transport layer, covering a top portion and side surfaces of each of the gallium nitride protruding structures; a gallium nitride layer, arranged on the electron transport layer and filling each of the grooves; a plurality of second conductivity type regions, where each of the second conductivity type regions extends downward from a top portion of the gallium nitride layer into one of the grooves, and the top portion of each of the gallium nitride protruding structures is higher than a bottom portion of each of the second conductivity type regions; and an anode, arranged on the gallium nitride layer and the second conductivity type regions.

15 Claims, 6 Drawing Sheets

(51) Int. Cl.
*H01L 29/66* (2006.01)
*H01L 21/02* (2006.01)
*H01L 29/06* (2006.01)
*H01L 29/861* (2006.01)

(52) U.S. Cl.
CPC ...... *H01L 29/6603* (2013.01); *H01L 29/6609* (2013.01); *H01L 29/66121* (2013.01); *H01L 29/66128* (2013.01); *H01L 29/66136* (2013.01); *H01L 29/66143* (2013.01); *H01L 29/8611* (2013.01); *H01L 29/8613* (2013.01); *H01L 29/872* (2013.01)

GALLIUM NITRIDE POWER DEVICE AND MANUFACTURING METHOD THEREOF

CROSS REFERENCE TO RELATED PATENT APPLICATION

The present application is the US national stage of PCT/CN2020/117576 filed on 2020 Sep. 25, which claims the priority of the Chinese patent application No. 201910919577.5 filed on 2019 Sep. 26, which application is incorporated herein by reference.

TECHNICAL FIELD

The present disclosure relates to the field of semiconductor manufacturing, and in particular, to a gallium nitride power device, and a method for manufacturing the gallium nitride power device.

BACKGROUND

The conventional silicon process has gradually reached its physical limits. Due to a large leakage current of a substrate, in high-power and high-frequency circuits, wide-bandgap semiconductor materials are better than semiconductors made by the conventional silicon process. As a third-generation semiconductor material, gallium nitride has the characteristics of large forbidden band width, high breakdown voltage, high electron saturation mobility, low dielectric constant, strong radiation resistance and good chemical stability, and is widely used in optical display, storage, detection, and high-temperature and high-frequency circuits. Gallium nitride power devices can provide lower gate charge, a fast switching speed, low parasitic parameters, and superior electrical parameters, and are expected to replace silicon power semiconductor devices.

A junction barrier Schottky barrier diode (JBSBD) device combines the advantages of PiN diode (a diode with a P-I-N structure consisting of a low-doped intrinsic semiconductor layer added between P-type and N-type semiconductor materials) and a Schottky barrier diode (SBD), which not only has the advantages of high breakdown voltage and low leakage current of the PiN diode, but also achieves the fast switching speed of the SBD. In combination with the advantages of gallium nitride materials, it is possible to achieve power diode devices in a range of 1200 V to 10 KV, which can be widely used in high-power applications such as aerospace, smart grid, and high-speed rail.

Figure 1:
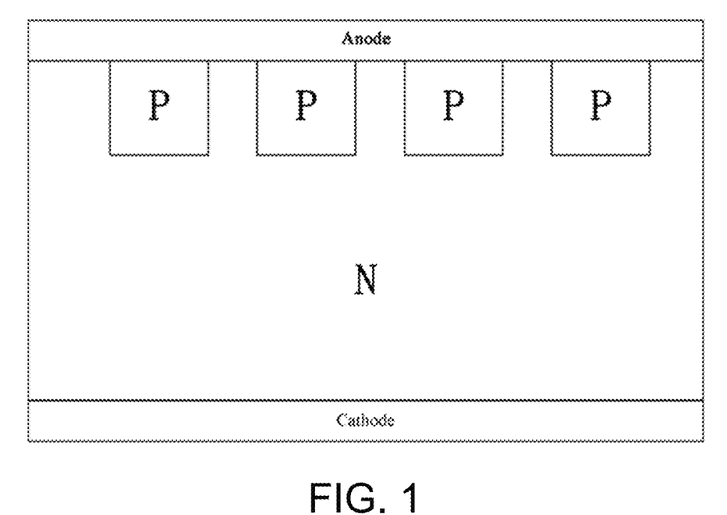
FIG. 1 is a schematic diagram of an exemplary longitudinal-structure gallium nitride JBS device.
Figure 2:
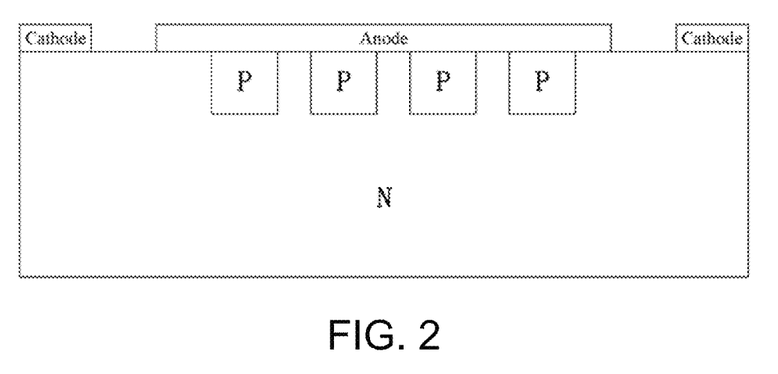
FIG. 2 is a schematic diagram of an exemplary horizontal-structure gallium nitride JBS device.

FIG. 1 is a schematic diagram of an exemplary longitudinal-structure gallium nitride JBS device, and FIG. 2 is a schematic diagram of an exemplary horizontal-structure gallium nitride JBS device. The longitudinal-structure JBS generally has higher voltage withstand capability, but the process cost is higher, while the voltage withstand capability of the horizontal-structure JBS is limited by a horizontal size, and therefore a larger device area is required to obtain a high withstand voltage.

SUMMARY

The present disclosure provides a gallium nitride power device and a manufacturing method thereof.

The present disclosure provides a gallium nitride power device, including: a gallium nitride substrate having a first conductivity type; cathodes, arranged on the gallium nitride substrate, including a first cathode and a second cathode spaced apart from the first cathode; a plurality of gallium nitride protruding structures having the first conductivity type, arranged on the gallium nitride substrate and between the first cathode and the second cathode, where a groove is formed between adjacent gallium nitride protruding structures; an electron transport layer, covering a top portion and side surfaces of each of the gallium nitride protruding structures; a gallium nitride layer having the first conductivity type, arranged on the electron transport layer and filling each of the grooves, where the electron transport layer is configured to form a conductive channel region at a position where the electron transport layer is arranged, and an electron mobility of the conductive channel region is higher than that of the gallium nitride layer; a plurality of second conductivity type regions, where each of the second conductivity type regions extends downward from a top portion of the gallium nitride layer into one of the grooves, the top portion of each of the gallium nitride protruding structures is higher than a bottom portion of each of the second conductivity type regions, and the first conductivity type is a conductivity type opposite to the second conductivity type; and an anode, arranged on the gallium nitride layer and each of the second conductivity type regions.

The present disclosure further provides a method for manufacturing a gallium nitride power device, including: obtaining a gallium nitride substrate of a first conductivity type; etching a plurality of grooves on a surface of the gallium nitride substrate, where the gallium nitride substrate retained between every two adjacent grooves forms a gallium nitride protruding structure; forming an electron transport layer covering a top portion and side surfaces of each of the gallium nitride protruding structures; forming a gallium nitride layer on the electron transport layer and filling each of the grooves with the gallium nitride layer, where the gallium nitride layer has the first conductivity type, the electron transport layer is configured to form a conductive channel region at a position where the electron transport layer is arranged, and an electron mobility of the conductive channel region is higher than that of the gallium nitride layer; forming a plurality of second conductivity type regions extending downward from a top portion of the gallium nitride layer into the grooves, respectively; and forming an anode and cathodes, where the anode is formed on the gallium nitride layer and the plurality of second conductivity type regions, and the cathodes are formed on a surface of the gallium nitride substrate and include a first cathode and a second cathode, where the gallium nitride layer and each of the gallium nitride protruding structures are located between the first cathode and the second cathode.

Details of one or more embodiments of the present disclosure are provided in the subsequent accompanying drawings and descriptions. Other features, objectives, and advantages of this application will become apparent from the specification, the accompanying drawings, and the claims.

BRIEF DESCRIPTION OF THE DRAWINGS

To better describe and illustrate embodiments and/or examples of the present disclosure, reference may be made to one or more drawings. Additional details or examples used to describe the drawings are not to be considered as limiting the scope of any of the disclosed invention, currently described embodiments and/or examples, and the best modes of the present disclosure currently understood.

DETAILED DESCRIPTION OF THE PREFERRED EMBODIMENTS

To help understand the present disclosure, the following describes the present disclosure more fully with reference to the related accompanying drawings. The accompanying drawings show preferred embodiments of the present disclosure. However, the present disclosure may be implemented in many different forms, and is not limited to the embodiments described in this specification. On the contrary, the embodiments are provided to make understanding of the disclosed content of the present disclosure more comprehensive.

Unless otherwise defined, meanings of all technical and scientific terms used in this specification are the same as that usually understood by a person skilled in the technical field to which the present disclosure belongs. Terms used in the specification of the present disclosure are merely intended to describe objectives of the specific embodiments, but are not intended to limit the present disclosure. The term "and/or" used in this specification includes any or all combinations of one or more related listed items.

It should be understood that when an element or layer is referred to as being "on", "adjacent to", "connected to" or "coupled to" other elements or layers, it can be directly located on, adjacent, connected or coupled to the other elements or layers, or there may be an intervening element or layer. Conversely, when an element is referred to as being "directly on", "directly adjacent to", "directly connected to" or "directly coupled to" other elements or layers, no intervening element or layer is present. It should be understood that although the terms first, second, and third, etc. can be used to describe various elements, components, regions, layers and/or portions, these elements, components, regions, layers and/or portions should not be limited by these terms. These terms are only used to distinguish one element, component, region, layer or portion from another element, component, region, layer or portion. Therefore, without departing from the teachings of the present disclosure, the first element, component, region, layer or portion discussed below may be expressed as a second element, component, region, layer or portion.

Terms indicating the spatial relationships such as "under", "below", "lower", "beneath", "above", and "upper" are used herein for the convenience of description, to describe the relationship between one element or feature and other elements or features shown in the figure. It can be understood that in addition to the orientations shown in the figures, the terms indicating the spatial relationships are also intended to include different orientations of a device in use and operation. For example, if the device in the figure is upside down, then an element or feature described as being "under", "beneath" or "below" other elements will be oriented to be "above" the other elements or features. Therefore, the exemplary terms "under" and "below" may include both an upper and a lower orientation. The device can be otherwise oriented (rotated by 90 degrees or in other orientations) and the spatial descriptions used here are interpreted accordingly.

The terms are used herein merely for purpose of describing specific embodiments and not as a limitation of the present disclosure. When used herein, the singular forms "a", "an" and "the" are also meant to include the plural form, unless otherwise clearly indicated. It should also be understood that the terms "composed of" and/or "including", when used in this specification, confirm the existence of the described features, integers, steps, operations, elements and/or components, but do not exclude the existence or addition of one or more other features, integers, steps, operations, elements, components and/or groups. As used herein, the term "and/or" includes any and all combinations of related listed items.

Embodiments of the present disclosure are described herein with reference to cross-sectional views which are used as the schematic diagrams of ideal embodiments (and intermediate structures) of the present disclosure. In this way, changes from displayed shapes caused by, for example, manufacturing technologies and/or tolerances can be expected. Therefore, the embodiments of the present disclosure should not be limited to specific shapes of the regions shown here, but include shape deviations caused by, for example, manufacturing. For example, an implanted region shown as a rectangle usually has round or curved features and/or implant concentration gradients at edges of the implanted region, rather than a binary change from the implanted region to a non-implanted region. Likewise, a buried region formed by implantation can result in some implantation in a region between the buried region and a surface through which the implantation proceeds. Therefore, regions shown in the figures are essentially schematic, and their shapes are not intended to show actual shapes of the regions of a device and are not intended to limit the scope of the present disclosure.

Semiconductor vocabularies used herein are technical vocabularies commonly used by persons skilled in the art. For example, for P-type and N-type impurities, to distinguish between doping concentrations, P+ type represents a P type with a heavy doping concentration, P type represents a P type with a medium doping concentration, P− type represents a P type with a light doping concentration, N+ type represents an N type with a heavy doping concentration, N type represents an N type with a medium doping concentration, and N− type represents an N type with a light doping concentration.

Figure 3:
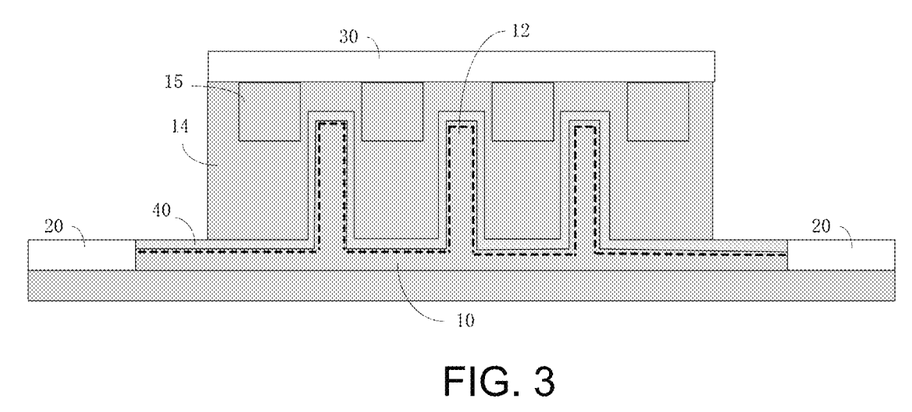
FIG. 3 is a schematic structural diagram of a gallium nitride power device according to an embodiment.

FIG. 3 is a schematic structural diagram of a gallium nitride power device according to an embodiment. The gallium nitride power device includes a gallium nitride substrate 10, an electron transport layer, gallium nitride protruding structures 12, a gallium nitride layer 14, a second conductivity type region 15, an anode 30, and cathodes 20.

The cathodes 20 are arranged on the gallium nitride substrate 10 of a first conductivity type, including a first cathode and a second cathode spaced apart from the first cathode. The cathode 20 on the left in FIG. 3 is the first cathode, and the cathode 20 on the right is the second cathode. In this embodiment, the first conductivity type is an N type, and the second conductivity type is a P type; in another embodiment, the first conductivity type may be a P type, and the second conductivity type may be an N type.

The gallium nitride protruding structure 12 has a first conductivity type, and is arranged on the gallium nitride substrate 10 and between the first cathode and the second cathode. The gallium nitride power device includes a plurality of gallium nitride protruding structures 12, and a groove is formed between every two adjacent gallium nitride protruding structures 12.

An electron transport layer, by selecting an appropriate material, may form a conductive channel region at a position where the electron transport layer is arranged (and a region within a certain range nearby). An electron mobility of the conductive channel region is higher than that of the gallium nitride layer 14. In an embodiment, the electron mobility of the conductive channel region is also higher than those of the gallium nitride substrate 10 and the gallium nitride protruding structures 12. In an embodiment shown in FIG. 3, the electron transport layer includes a heterojunction-inducing layer 40 covering a top portion and side surfaces of each of the gallium nitride protruding structures 12. In this embodiment, the heterojunction-inducing layer 40 further covers a bottom portion of each of the grooves, and a surface of the gallium nitride substrate 10 located between the first cathode and the second cathode. The heterojunction-inducing layer 40, by selecting a material that can form a heterojunction with gallium nitride, forms a heterojunction at a contact interface with a gallium nitride material below, thereby forming a two-dimensional electron gas (2-DEG) layer on a surface of the gallium nitride material close to the contact interface. That is, a contact interface between the heterojunction-inducing layer 40 and the gallium nitride protruding structure 12, and a contact interface between the heterojunction-inducing layer 40 and the gallium nitride substrate 10 form heterojunctions, so that a two-dimensional electron gas layer is formed on one side of the contact interface close to the gallium nitride. The dashed line in FIG. 3 shows a position of the two-dimensional electron gas layer. Because the piezoelectric polarization effect imposed on the gallium nitride protruding structure 12 by a part of the heterojunction-inducing layer 40 located on a sidewall of the gallium nitride protruding structure 12 is smaller than that imposed on the gallium nitride protruding structure 12/gallium nitride substrate 10 by a part (horizontal part) of the heterojunction-inducing layer 40 at a top portion of the gallium nitride protruding structure 12 and a bottom portion of the groove, an electron concentration of a sidewall channel layer is lower than a channel electron concentration of the top portion and a bottom portion of the gallium nitride protruding structure 12. In a case of a reverse withstand voltage, it is easier for a device to completely deplete electrons, which further ensures the voltage withstand capability of a device. The gallium nitride layer 14 of the first conductivity type is arranged on the electron transport layer and fills each of the grooves, so that the gallium nitride layer 14 is higher than the top portion of each of the gallium nitride protruding structures 12 (and overflows from each of the grooves). Each second conductivity type region 15 extends downward from a top portion of the gallium nitride layer 14 into one of the grooves, and the top portion of each gallium nitride protruding structure 12 is higher than a bottom portion of each second conductivity type region 15, thereby forming a staggered structure of the second conductivity type region 15 and the gallium nitride protruding structure 12. The anode 30 is arranged on the gallium nitride layer 14 and the plurality of second conductivity type regions 15. In an embodiment, the anode 30 and the cathodes 20 are conductive electrodes, and structures such as metals can be selected.

The above-mentioned gallium nitride power device combines the advantages of a longitudinal structure and a horizontal structure, which not only has high voltage withstand capability, but also can achieve a balance between the area and thickness of the device, reducing the complexity of the process and the cost. By providing an electron transport layer with higher electron mobility than the gallium nitride layer 10, the electron mobility in the current conduction path is increased during positive conduction of the device, thereby reducing an on-resistance. Besides, the top portion of each of the gallium nitride protruding structures 12 is higher than a bottom portion of each of the second conductivity type regions 15, and therefore a staggered structure is formed. In a case of a reverse withstand voltage of the device, the second conductivity type regions 15 may completely deplete channel electrons of the electron transport layer located on the top portions of the gallium nitride protruding structures 12 and a portion of electrons located on sidewalls of the gallium nitride protruding structures 12, thereby blocking a leakage path and ensuring the voltage withstand capability of a device.

Figure 8:
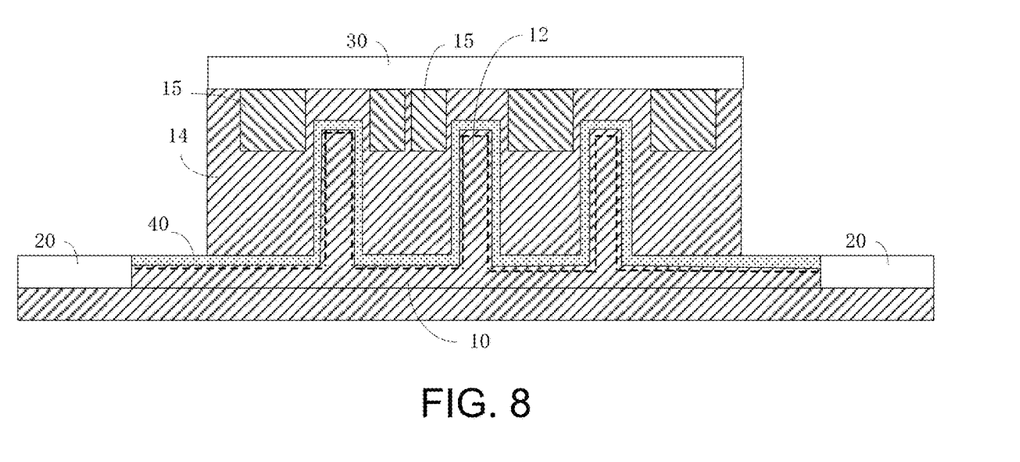
FIG. 8 is a schematic structural diagram of a gallium nitride power device according to yet another embodiment.

In an embodiment shown in FIG. 3, each groove is correspondingly provided with one second conductivity type region 15 extending into the groove. In another embodiment, the quantity of second conductivity type regions 15 extending into different grooves may be the same or different, and the quantity of second conductivity type regions 15 extending into each groove may be one or at least two, as shown in FIG. 8.

In an embodiment, the heterojunction-inducing layer 40 is an aluminum gallium nitride (AlGaN) layer. Aluminum gallium nitride can form a heterojunction with gallium nitride through piezoelectric polarization and spontaneous polarization, and the generated two-dimensional electron gas has high electron concentration, high electron mobility and high electron saturation speed. Therefore, an on-resistance of the device can be reduced. In an embodiment, the electron transport layer has an island structure.

In an embodiment, the gallium nitride power device is a junction barrier Schottky diode.

Figure 4:
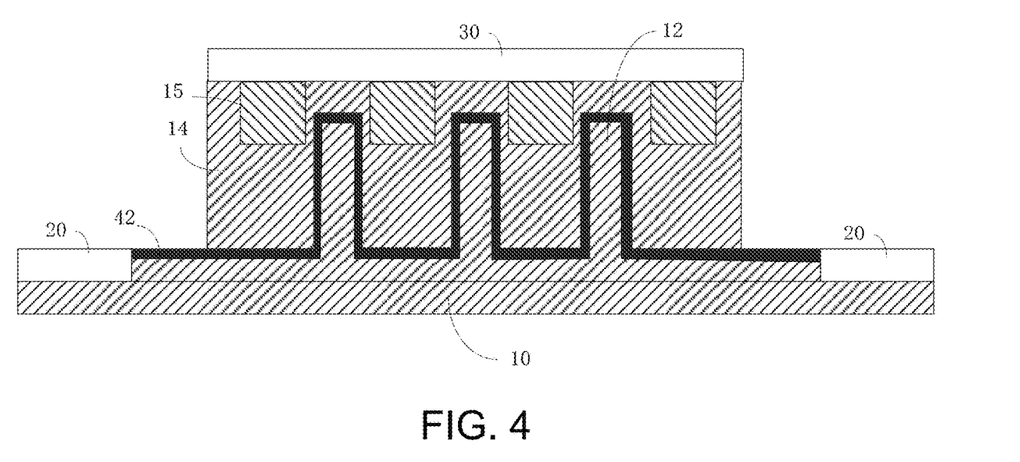
FIG. 4 is a schematic structural diagram of a gallium nitride power device according to another embodiment.

FIG. 4 is a schematic structural diagram of a gallium nitride power device according to another embodiment, and a main difference between FIG. 4 and the embodiment shown in FIG. 3 is that the electron transport layer is a graphene layer 42. Graphene is a single-layer carbon polymer whose conduction band and valence band meet at the Dirac point, and is called a zero band gap semiconductor. As an emerging material, graphene has extremely high carrier mobility, submicron-scale ballistic transmission characteristics at room temperature, quantum Hall effect, excellent mechanical properties, electron spin transmission, superconductivity and other features, and is considered as an ideal electrode and semiconductor material. Therefore, graphene has a very broad development prospect in nanoelectronic and spintronic components, and at the same time has good compatibility in a gallium nitride process.

Figure 5:
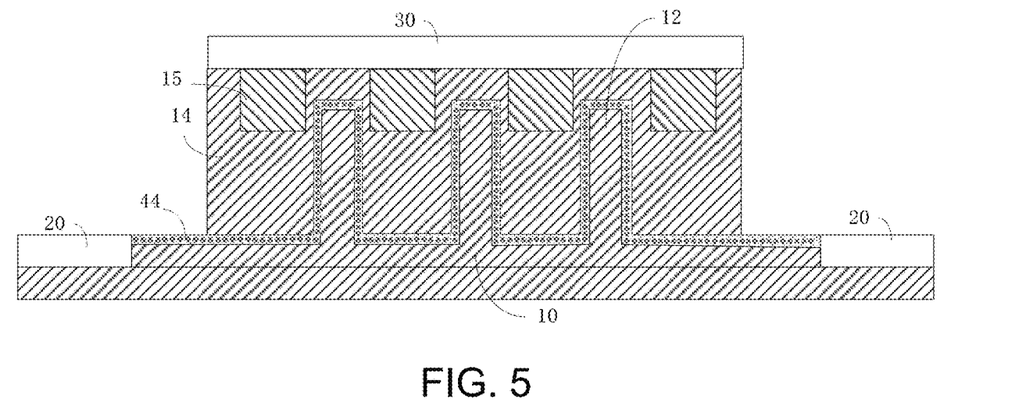
FIG. 5 is a schematic structural diagram of a gallium nitride power device according to another embodiment.

FIG. 5 is a schematic structural diagram of a gallium nitride power device according to another embodiment, and a main difference between FIG. 5 and the embodiment shown in FIG. 3 is that the electron transport layer is a carbon nanotube layer 44. Each dot in the carbon nanotube layer 44 in FIG. 5 represents a single carbon nanotube. A carbon nanotube has good electrical conductivity and a structure that is the same as a sheet structure of graphene, and is a one-dimensional quantum wire with good electrical conductivity. The carbon nanotube can be grown laterally on gallium nitride to reduce lattice defects in gallium nitride. Simultaneously, resistivity of the carbon nanotube is lower than that of N-type gallium nitride materials, which can effectively improve current diffusion capability and reduce an on-resistance.

Figure 6:
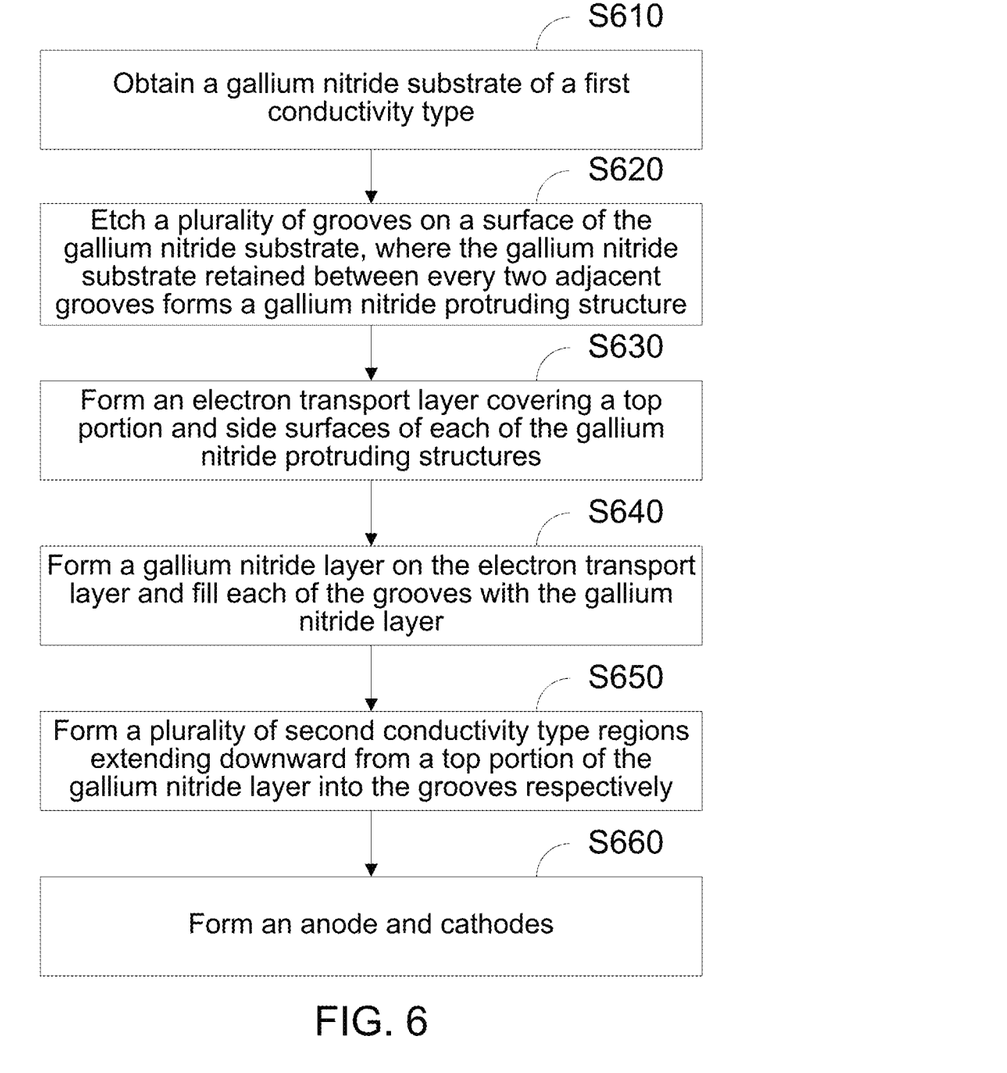
FIG. 6 is a flowchart of a manufacturing method of a gallium nitride power device according to an embodiment.

The present disclosure further provides a method for manufacturing a gallium nitride power device, which is used to manufacture the gallium nitride power device of any of the above embodiments. FIG. 6 is a flowchart of a manufacturing method of a gallium nitride power device, including the following operations:

S610. Obtain a gallium nitride substrate of a first conductivity type.

In this embodiment, the first conductivity type is an N type, and a second conductivity type is a P type; in another embodiment, the first conductivity type is a P type, and the second conductivity type is an N type.

S620. Etch a plurality of grooves on a surface of the gallium nitride substrate, where the gallium nitride substrate retained between every two adjacent grooves forms a gallium nitride protruding structure.

Figure 7A:
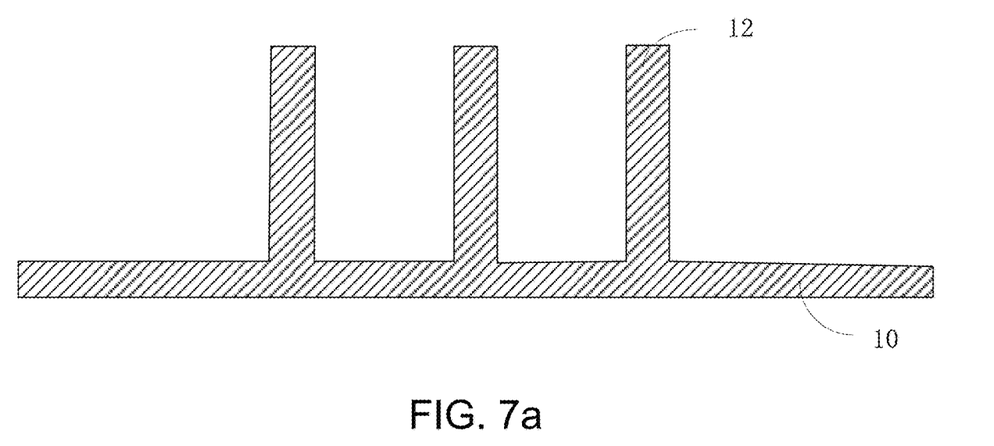
FIG. 7a to FIG. 7d are schematic diagrams of device intermediate structures in various operations of manufacturing a gallium nitride power device by using the method shown in FIG. 6.

A plurality of grooves with appropriate depths are etched on a front surface of the gallium nitride substrate 10. The gallium nitride substrate 10 between grooves is not etched, and thus is retained as the gallium nitride protruding structures 12. FIG. 7a is a schematic structural diagram of the device after operation S620 is completed.

S630. Form an electron transport layer covering a top portion and side surfaces of each of the gallium nitride protruding structures.

Figure 7B:
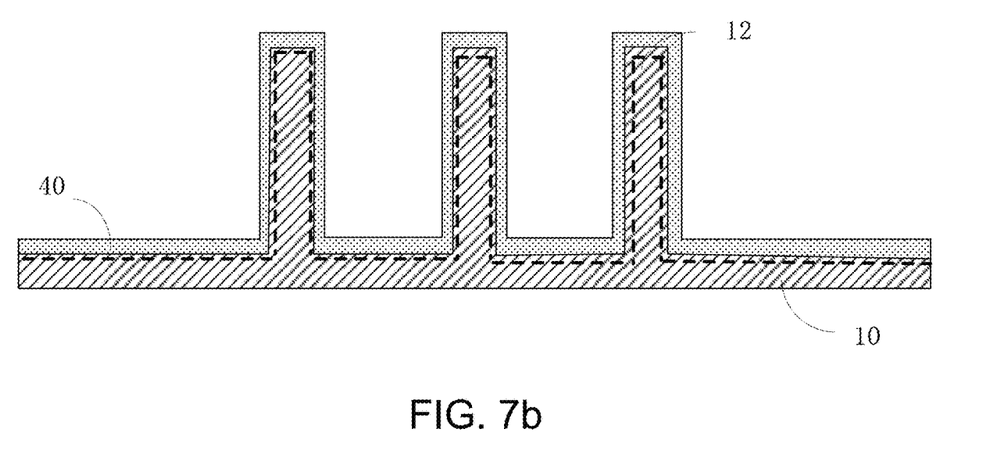

FIG. 7b is a schematic structural diagram of the device after operation S630 is completed. In this embodiment, the electron transport layer is an aluminum gallium nitride layer formed by epitaxy on a surface of the structure obtained in operation S620, and serves as a heterojunction-inducing layer 40, to form a heterojunction at a contact interface with a gallium nitride material below. In another embodiment, the electron transport layer is a graphene layer; in an embodiment, the electron transport layer is a carbon nanotube. The graphene layer/carbon nanotube can be manufactured in a manner known in the art.

S640. Form a gallium nitride layer on the electron transport layer and fill each of the grooves with the gallium nitride layer.

Figure 7C:
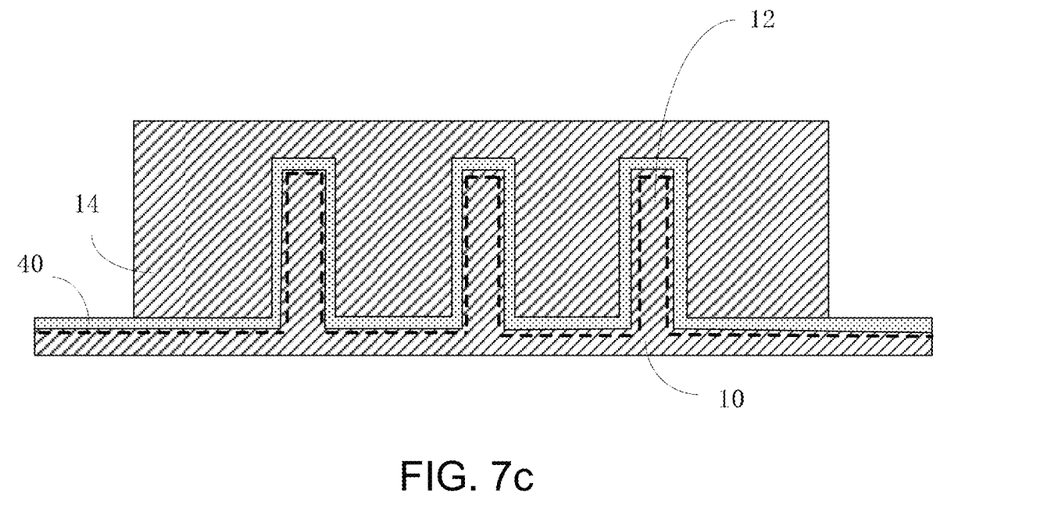

FIG. 7c is a schematic structural diagram of the device after operation S640 is completed. In this embodiment, the gallium nitride layer 14 is formed by an epitaxial process. The electron transport layer is configured to form a conductive channel region at a position where the electron transport layer is arranged, and an electron mobility of the conductive channel region is higher than that of the gallium nitride layer 14.

S650. Form a plurality of second conductivity type regions extending downward from a top portion of the gallium nitride layer into the grooves respectively.

Figure 7D:
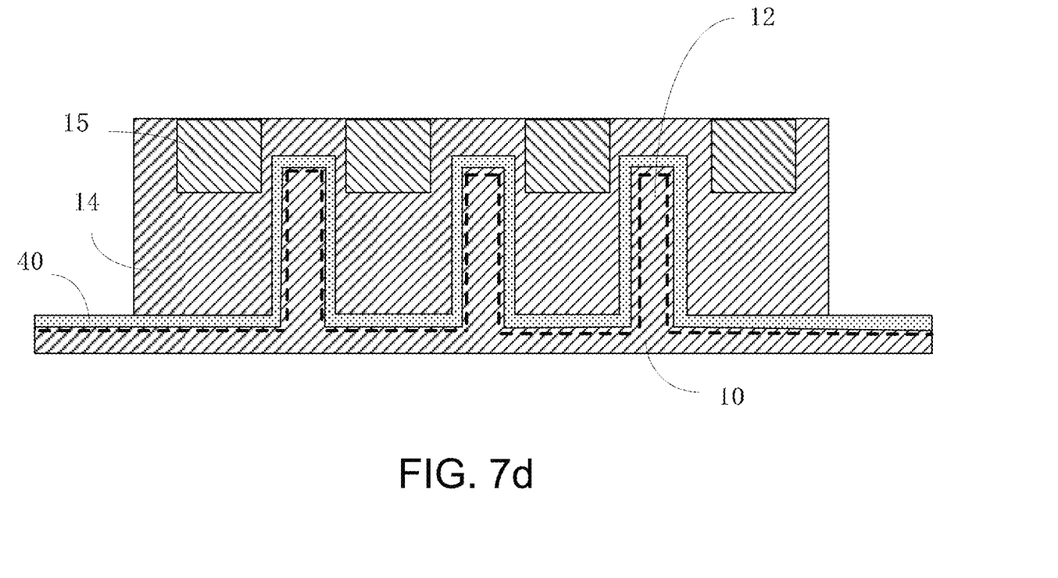

FIG. 7d is a schematic structural diagram of the device after operation S650 is completed. In this embodiment, the second conductivity type region 15 is a gallium nitride region of the second conductivity type formed by epitaxy.

S660. Form an anode and cathodes.

After operation S660 is completed, the structure shown in FIG. 3 is obtained. The anode 30 is formed on the gallium nitride layer 14 and the second Zo conductivity type region 15; the cathodes 20 are formed on a surface of the gallium nitride substrate 10, including a first cathode on the left side and a second cathode on the right side in FIG. 3. The gallium nitride layer 14 and each gallium nitride protruding structure 12 are located between the first cathode and the second cathode.

The foregoing embodiments only describe several implementations of the present disclosure, and their description is specific and detailed, but cannot therefore be understood as a limitation to the patent scope of the present disclosure. It should be noted that, a person of ordinary skill in the art may further make some variations and improvements without departing from the concept of the present disclosure, and the variations and improvements belong to the protection scope of the present disclosure. Therefore, the protection scope of the patent of the present disclosure shall be topic to the claims.

What is claimed is:

1. A gallium nitride power device, comprising:
   a gallium nitride substrate, having a first conductivity type;
   a cathode, arranged on the gallium nitride substrate, comprising a first cathode and a second cathode spaced apart from the first cathode;
   a plurality of gallium nitride protruding structures having the first conductivity type, arranged on the gallium nitride substrate and between the first cathode and the second cathode, wherein a groove is formed between adjacent gallium nitride protruding structures;
   an electron transport layer, covering a top portion and side surfaces of each of the gallium nitride protruding structures;
   a gallium nitride layer having the first conductivity type, arranged on the electron transport layer and filling each of the grooves, wherein the electron transport layer is configured to form a conductive channel region at a position where the electron transport layer is arranged, and an electron mobility of the conductive channel region is higher than that of the gallium nitride layer;
   a plurality of second conductivity type regions, wherein each of the second conductivity type regions extends downward from a top portion of the gallium nitride layer into one of the grooves, the top portion of each of the gallium nitride protruding structures is higher than a bottom portion of each of the second conductivity type regions, and the first conductivity type is a conductivity type opposite to the second conductivity type; and
   an anode, arranged on the gallium nitride layer and each of the second conductivity type regions.

2. The gallium nitride power device according to claim 1, wherein the electron transport layer comprises a heterojunction-inducing layer covering the top portion and the side surfaces of each of the gallium nitride protruding structures, and a contact interface between the heterojunction-inducing layer and a gallium nitride material below the heterojunction-inducing layer forms a heterojunction, such that a two-dimensional electron gas layer is formed on one side of the contact interface close to the gallium nitride material.

3. The gallium nitride power device according to claim 2, wherein the heterojunction-inducing layer comprises an aluminum gallium nitride layer.

4. The gallium nitride power device according to claim 1, wherein the electron transport layer comprises a carbon nanotube layer.

5. The gallium nitride power device according to claim 1, wherein the electron transport layer comprises a graphene layer.

6. The gallium nitride power device according to claim 1, wherein the gallium nitride power device is a junction barrier Schottky diode.

7. The gallium nitride power device according to claim 1, wherein the electron transport layer further covers a bottom portion of each of the grooves, and covers a surface of the gallium nitride substrate between the first cathode and the second cathode.

8. The gallium nitride power device according to claim 1, wherein each of the grooves is correspondingly provided with one or at least two of the second conductivity type regions extending into the groove.

9. The gallium nitride power device according to claim 1, wherein the first conductivity type is an N type, and the second conductivity type is a P type.

10. The gallium nitride power device according to claim 9, wherein the plurality of second conductivity type regions are a plurality of P-doped gallium nitride regions.

11. A method for manufacturing a gallium nitride power device, comprising:
obtaining a gallium nitride substrate of a first conductivity type,
etching a plurality of grooves on a surface of the gallium nitride substrate, wherein the gallium nitride substrate retained between every two adjacent grooves forms a gallium nitride protruding structure;
forming an electron transport layer covering a top portion and side surfaces of each of the gallium nitride protruding structures;
forming a gallium nitride layer on the electron transport layer and filling each of the grooves with the gallium nitride layer, wherein the gallium nitride layer has the first conductivity type, the electron transport layer is configured to form a conductive channel region at a position where the electron transport layer is arranged, and an electron mobility of the conductive channel region is higher than that of the gallium nitride layer;
forming a plurality of second conductivity type regions extending downward from a top portion of the gallium nitride layer into the grooves respectively; and
forming an anode and cathodes, wherein the anode is formed on the gallium nitride layer and the plurality of second conductivity type regions, and the cathodes are formed on a surface of the gallium nitride substrate and comprise a first cathode and a second cathode, wherein the gallium nitride layer and each of the gallium nitride protruding structures are located between the first cathode and the second cathode.

12. The method according to claim 11, wherein the forming of the electron transport layer comprises forming an aluminum gallium nitride layer by epitaxy.

13. The method according to claim 11, wherein the forming of the gallium nitride layer is carried out by epitaxy, and the forming of the plurality of second conductivity type regions extending downward from a top portion of the gallium nitride layer into the grooves respectively is forming gallium nitride regions of a second conductivity type by epitaxy.

14. The method according to claim 11, wherein in the forming of the electron transport layer covering a top portion and side surfaces of the gallium nitride protruding structure, the electron transport layer formed is a graphene layer.

15. The method according to claim 11, wherein in the forming of the electron transport layer covering a top portion and side surfaces of the gallium nitride protruding structure, the electron transport layer formed is a carbon nanotube.

* * * * *